US012634105B2

(12) United States Patent
Kasibhatla et al.

(10) Patent No.: US 12,634,105 B2
(45) Date of Patent: **\*May 19, 2026**

(54) POWER EFFICIENT CIRCUITS AND METHODS FOR PHASE ALIGNMENT

(71) Applicant: Rambus Inc., San Jose, CA (US)

(72) Inventors: Pavan Kumar Kasibhatla, Bengaluru (IN); Jitendra Mishra, Bangalore (IN)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/983,766

(22) Filed: Dec. 17, 2024

(65) Prior Publication Data

US 2025/0175318 A1     May 29, 2025

Related U.S. Application Data

(63) Continuation of application No. 17/974,970, filed on Oct. 27, 2022, now Pat. No. 12,212,646.

(60) Provisional application No. 63/277,314, filed on Nov. 9, 2021.

(51) Int. Cl.
H04L 7/00 (2006.01)
H03L 7/081 (2006.01)
H04L 7/033 (2006.01)

(52) U.S. Cl.
CPC .......... H04L 7/0025 (2013.01); H03L 7/0814 (2013.01); H04L 7/033 (2013.01)

(58) Field of Classification Search
CPC ....... G11C 7/222; G11C 11/4076; H03L 7/07; H03L 7/0814; H04L 7/0025; H04L 7/033
See application file for complete search history.

(56) References Cited

U.S. PATENT DOCUMENTS

| | | | |
|---|---|---|---|
| 5,485,490 A | 1/1996 | Leung et al. | |
| 6,064,272 A | 5/2000 | Rhee | |
| 6,133,773 A | 10/2000 | Garlepp et al. | |
| 6,759,881 B2 | 7/2004 | Kizer et al. | |
| 6,762,626 B1 | 7/2004 | Dreps et al. | |
| 7,109,767 B1 | 9/2006 | Amick et al. | |
| 7,795,937 B2 | 9/2010 | Smith et al. | |
| 8,154,330 B2 | 4/2012 | Kao et al. | |
| 9,614,537 B1 | 4/2017 | Nandwana et al. | |
| 10,157,637 B1 | 12/2018 | Marrow et al. | |
| 12,212,646 B2 * | 1/2025 | Kasibhatla | .......... G11C 11/4076 |
| 2008/0101500 A1 * | 5/2008 | Voloshin | ............. H04L 27/2078 |
| | | | 375/295 |
| 2015/0256326 A1 | 9/2015 | Simpson et al. | |

(Continued)

OTHER PUBLICATIONS

Khawshe, Vijay et al., "A 2.4Gbps-4.8Bbps XDR-DRAM I/O (XIO) Link", 2009 22nd International Conference on VLSI Design, 2009, pp. 373-378, doi: 10.1109/VLSI.Design.2009.65. 6 pages.

(Continued)

*Primary Examiner* — David B Lugo
(74) *Attorney, Agent, or Firm* — Silicon Edge Law Group LLP; Arthur J. Behiel

(57) ABSTRACT

A timing-calibration circuit uses an active phase interpolator to calibrate clock delays through a number of passive fractional delay elements. The timing-calibration circuit minimizes system-wide power consumption by limiting the number and usage of active phase interpolators for delay adjustment in favor of the passive fractional delay elements.

19 Claims, 3 Drawing Sheets

(56)                References Cited

U.S. PATENT DOCUMENTS

| 2017/0149555 A1 | 5/2017 | Cohen et al. |
| 2020/0349996 A1 | 11/2020 | Giovannini et al. |

OTHER PUBLICATIONS

Peterson, "Fly-by Topology Routing for DDR3 and DDR4 Memory," https://resources.altium.com/p/fly-topology-routing-ddr3-and-ddr4-memory, created Dec. 7, 2018 and updated Apr. 5, 2021. 8 pages.
Rambus Inc., "Enhanced FlexPhase(tm) Timing Adjustments," rambus.com/enhanced-flexphase-timing-adjustments, Aug. 11, 2015. 2 pages.
Rambus Inc., "FlexPhase(tm) Timing Adjustment Circuits", Downloaded on Sep. 22, 2021 from: https://www.rambus.com/flexphase-timing-adjustment-circuits-2. Aug. 13, 2015. 3 pages.
Rambus Inc., "Fly-by Command Address," https://www.rambus.com/fly-by-command-address/ Downloaded Oct. 24, 2021. 5 pages.
Rambus Inc., "Phase Interpolator-Based CDR," https://www.rambus.com/phase-interpolator-based-cdr/ Downloaded Oct. 24, 2021. 3 pages.
Wikipedia, "Memory Module," retrieved from "https://en.wikipedia.org/w/index.php?title=Memory_module&oldid=1036074492", last edited on Jul. 29, 2021, at 09:55 (UTC). 3 pages.

* cited by examiner

POWER EFFICIENT CIRCUITS AND METHODS FOR PHASE ALIGNMENT

TECHNICAL FIELD

The subject matter presented herein relates generally to methods and systems for phase adjusting signals communicated within and between integrated-circuit components.

BACKGROUND

Computers commonly include memory modules, printed-circuit boards on which are mounted integrated-circuit (IC) memory devices or packages of memory devices. Memory modules support the memory devices physically and provide interconnectivity for signals used to read from and write to the memory devices. These signals include the data to be stored in (written) or retrieved from (read) the memory devices, data strobes that serve as timing references for accompanying data signals, read and write commands, addresses specifying storage locations in the memory devices, and one or more clock signals that serve as timing references for command and address signals.

Synchronizing communication between a memory controller and a collection of memory devices can be difficult. In a write transaction, for example, the memory controller issues write-data signals to the memory devices with a strobe signal timed to the data signals. The memory devices time receipt of the data to the strobe. The command and address signals take different paths to the memory devices than do the data signals and are timed to a different reference, the clock signal. Data and clock signals thus arrive at the memory devices with a timing offset.

Some memory modules distribute a clock signal to the memory devices in a "fly-by" topology in which the clock signal reaches each memory device in succession along a fly-by path so that the memory devices experience different clock timing. Each memory device thus requires bespoke timing calibration to synchronize the arriving clock signal with the associated data or data-strobe signal. At higher data rates, timing may be so critical that each data signal requires precise timing calibration. Memory modules can have hundreds of data nodes and calibrating each data signal can be power and area intensive. There is therefore a demand for more efficient means for timing calibration across large numbers of signals and nodes.

BRIEF DESCRIPTION OF THE FIGURES

The illustrations are by way of example, and not by way of limitation. Like reference numerals similar elements.

DETAILED DESCRIPTION

Figure 1:
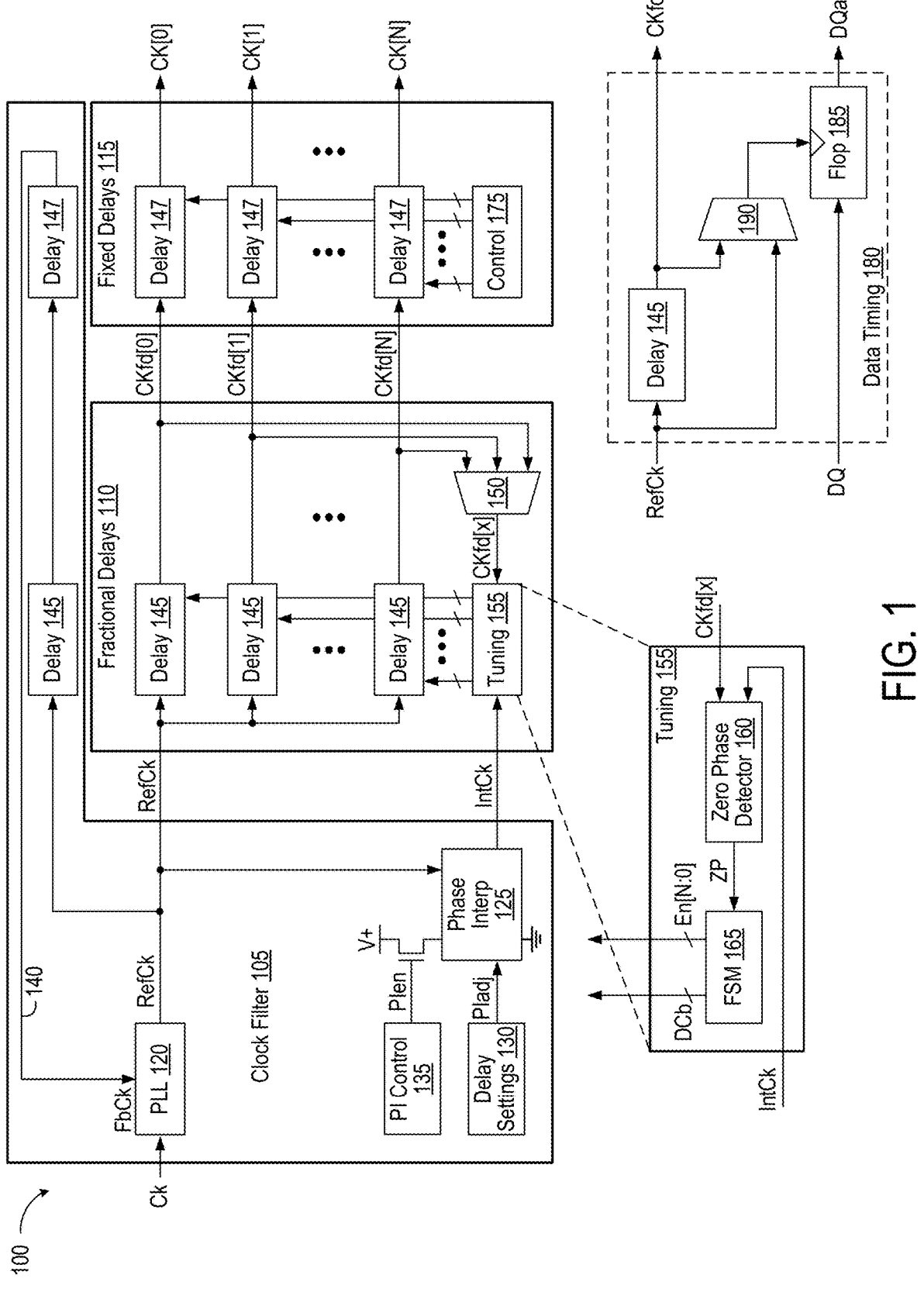
FIG. 1 depicts a timing-calibration circuit 100 that can be instantiated on an integrated circuit to precisely align signals for receipt at a common destination.

FIG. 1 depicts a timing-calibration circuit 100 that can be instantiated on an integrated circuit, such as a memory device, to precisely align signals for receipt at a common destination. In this example, an external clock signal Ck serves as a frequency reference to produce N+1 individually phase adjusted output clock signals CK[N:0]. A clock filter 105 produces a reference clock signal RefCk and an interpolated clock signal IntClk, the latter exhibiting a desired clock-destination timing. A fractional delay circuit 110 derives N+1 clock signals CKfd[N:0] from reference clock signal RefCk and phase aligns them with interpolated clock signal IntCk. A fixed-delay circuit 115 can be included to impose a pre-calibration delay on clock signals CKfd[N:0], ultimately producing the set of clock signals CK[N:0]. Timing-calibration circuit 100 minimizes power consumption by limiting the number and usage of relatively power-hungry circuits for delay adjustments.

Clock filter 105 includes a phase-locked loop (PLL) 120, a phase interpolator 125, a delay-setting register 130, a control register 135, and a feedback path 140 with a series of delay elements 145 and 147. Clock filter 105 removes phase noise from clock signal Ck to deliver the filtered reference clock signal RefCk. Phase interpolator 125, when an enable signal Plen is asserted, interpolates between phases of clock signal RefCk to issue an interpolated clock signal IntCk that can vary over a range of phases. Feedback path 140 to an input of PLL 120 simulates a load, and therefore the delay, associated with the destinations of delayed clock signals CK[N:0]. PLL 120 adjusts the phase of reference clock signal RefCk to minimize the phase error between (i.e., to "lock") clock signal Ck and feedback signal FbCk.

Fractional delay circuit 110 includes N+1 independently adjustable passive delay elements 145, one for each clock signal CKfd[N:0]. These elements 145 are structurally identical to the one in feedback path 140; however, the element 145 in feedback path 140 has a control input (not shown) tied to a value corresponding to a minimum delay setting, whereas the control inputs to the elements 145 within fractional delay circuit 110 are available to a tuning circuit 155. Tuning circuit 155 is thus able to adjust the delays through fractional delay circuit 110. Feedback path 140 mimics the forward clock path to track supply-voltage and temperature fluctuations.

A multiplexer 150 selectively directs each clock signal CKfd[N:0] to a tuning circuit 155 that controls the delays through passive delay elements 145. Delay elements 145 are passive in that they do not rely on an external power source, in contrast to the active, powered phase interpolator 125. In one embodiment, for example, each delay element 145 exhibits a programable RC (for resistive and capacitive) time constant that can be changed by selecting more or fewer resisters in series, capacitors in parallel, or both. Delay elements 145 are "fractional" in that they impose delays on reference clock signal RefClk that are fractions of the period of clock signal RefClk. In one embodiment, for example, each delay element 145 selectively imposes a delay that is an integer multiple of the period of clock signal RefClk divided by a power of two (e.g. $2^6$=64). Each delay element 145 can thus be controlled to introduce from zero to $^{63}/_{64}{}^{th}$ of one clock cycle.

Tuning circuit 155 includes a zero-phase detector 160 and a finite state machine 165. Zero-phase detector 160 asserts a zero-phase output signal ZP when the phase of interpolated clock signal IntClk is phase aligned with a clock signal CKfd[x] selected from one of delay elements 145. State machine 165 issues control signals DCb on a like-named bus to all N+1 delay elements 145. Each delay element 145 includes a storage element (not shown) that can latch the value expressed on bus DCb. Enable lines En[N:0], one to each delay element 145, allow state machine 165 to enable and calibrate each delay element 145 one at a time. Fixed delay circuit 115 includes N+1 delay elements 147 and a control circuit 175 that can independently control the delay through elements 147. Delay circuit 115 can be included to make gross delay adjustments to account for signal-propagation delays for lower-frequency operation.

FIG. 1 includes a data-timing circuit 180 at lower right to show how an instance of fractional delay element 145 and sequential element 185 (a flip flop) can be used to adjust the timing of a data signal DQ. A multiplexer 190 allows delay 145 to be bypassed e.g. for testing. Delay element 145 delays clock signal RefCk to issue a phase-adjusted clock signal CKfd, which is applied to a clock node of element 185 to retime data signal DQ to a phase-adjusted data signal DQa.

Figure 2:
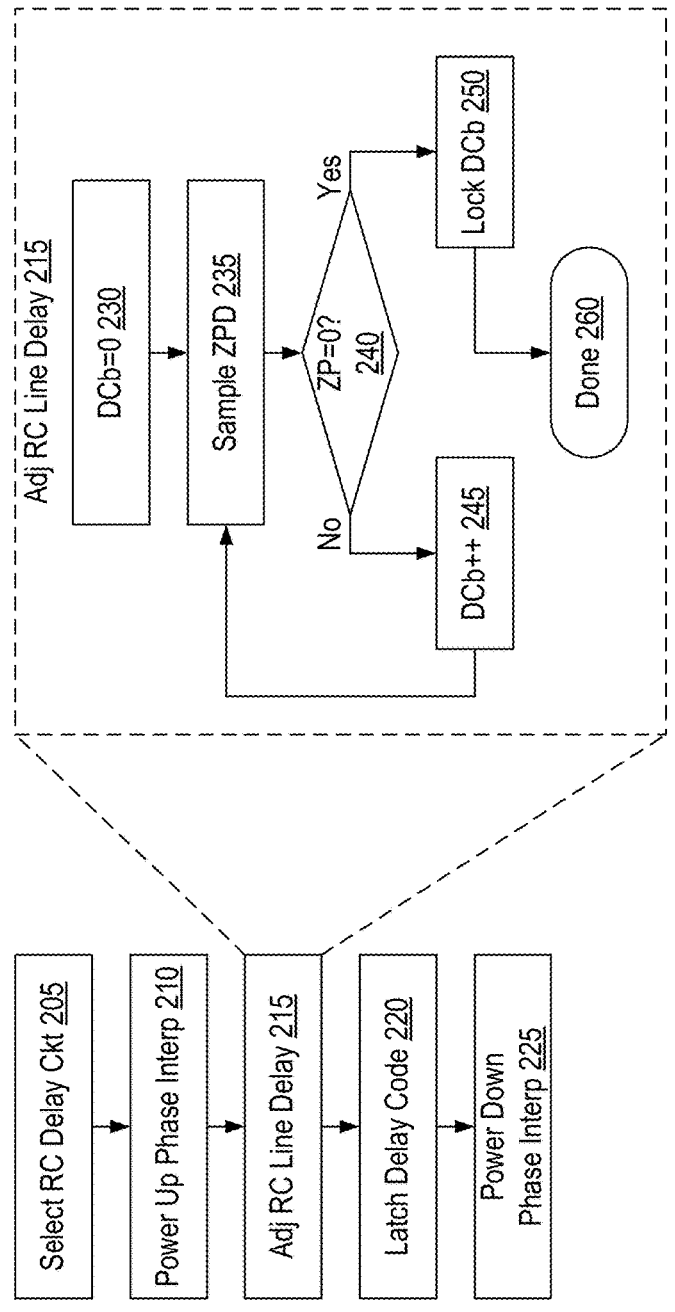
FIG. 2 is a flowchart 200 illustrating a calibration sequence for fractional delay circuit 110 of FIG. 1 in accordance with one embodiment.

FIG. 2 is a flowchart 200 illustrating a calibration sequence for fractional delay circuit 110 of FIG. 1 in accordance with one embodiment. Tuning circuit 155 enables one of delay elements 145 for calibration (205) and control circuit 135 powers on phase interpolator 125 (210). Tuning circuit 155 then asserts the enable signal En[x] for the selected delay element 145 adjusts control bits DCb to adjust the delay through the enabled delay elements 145 until the clock signal CKfd[x] from the selected delay element is phase aligned with interpolated clock signal IntClk (215). Phase detector 160 asserts signal ZP (ZP transitions from zero to one) and state machine 165 causes the selected delay element 145 to latch the delay code expressed as DCb (220) so that the newly calibrated delay element 145 retains that delay setting. State machine 165 then de-asserts the enable signal En[x] and returns delay code DCb to zero. The calibration sequence can then proceed to the next delay element 145. Once the delay element or elements are calibrated, control circuit 135 turns phase interpolator 125 off to save power.

In general, phase interpolators are substantially larger and less energy efficient than passive delay elements but advantageously tend to produce less phase noise, or "jitter." Timing-calibration circuit 100 benefits from the quality of clock signal IntClk during calibration while limiting both the number and usage of this power-hungry circuit. This fractional-delay calibration scheme is especially efficient for systems that include large numbers of signals that benefit from fractional-delay calibration.

The phase adjustment of step 215 can be carried out in the manner detailed at the right side of FIG. 2. State machine 165 begins with bits DCb set to zero (230), the lowest delay setting, before sampling signal ZP from phase detector 160 (235). Per decision 240, if signal ZP is zero, indicative of phase misalignment, bits DCb are incremented (245) and the process returns to step 235. When alignment is reached, state machine 165 locks bits DCb (250) and the calibration is finished for the delay element 145 under consideration (260).

Figure 3:
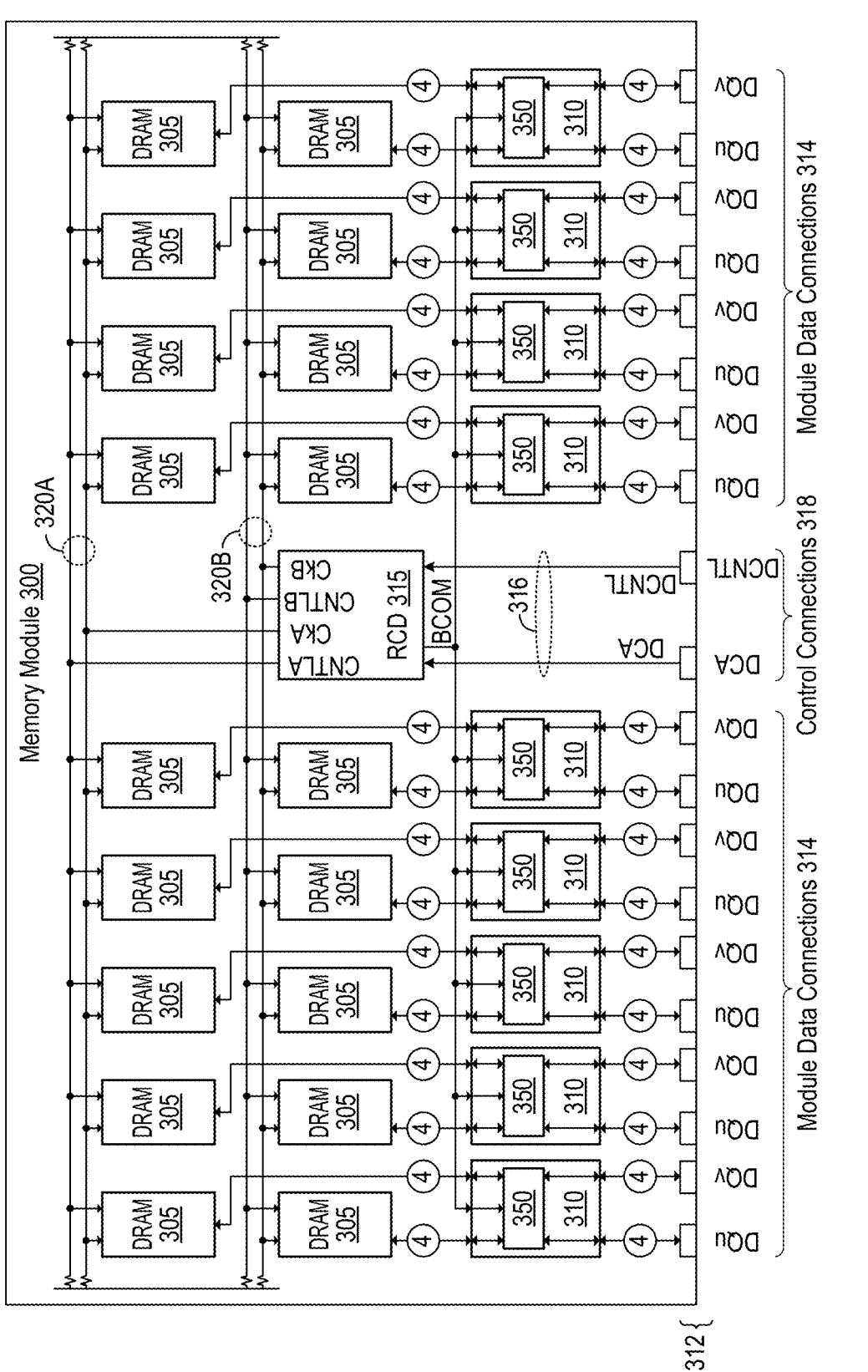
FIG. 3 depicts a memory module 300 that communicates nine eight-bit data bytes (72 data bits) in parallel.

FIG. 3 depicts a memory module 300 that communicates nine eight-bit data bytes (72 data bits) in parallel. Strobe signals that accompany the data signals with timing information can be included but are omitted from this illustration. These and other signals can be calibrated on a per-signal basis using timing-calibration circuits of the type detailed above.

Module 300 includes e.g. eighteen DRAM components 305 on one or both sides of a printed-circuit board. Each component 305 may include multiple DRAM die, or multiple DRAM stacked packages. Each DRAM component 305 communicates four-bit-wide (×4, or a "nibble"), though different data widths and different numbers of components and dies can be used in other embodiments. Module 300 also includes nine data-buffer components 310, or "data buffers." Each data-buffer component 310 directs data between two DRAM components 305 and two data ports DQu and DQv of a module connector 312. Each DRAM component 305 communicates ×4 data, and each data-buffer component 310 communicates ×8 data from two simultaneously active DRAM components 305. Though not shown here, each DRAM component 305 also communicates a complementary pair of timing reference signals (e.g. strobe signals) that time the transmission and receipt of data signals.

A memory controller (not shown) directs command, address, control, and clock signals on primary ports DCA and DCNTL to control the flow of data to and from module 300 via eighteen groups of data links DQu and DQv to module data connections 314. An address-buffer component 315, alternatively called a "Registering Clock Driver" (RCD), selectively interprets and retransmits the control signals on a module control interface 316 (signals DCA and DCNTL) from module control connections 318 and communicates appropriate command, address, control, and clock signals to a first set of memory components 305 via a first memory-component control interface 320A and to a second set of memory components 305 via a second memory-component control interface 320B. Addresses associated with the commands on primary port DCA identify target collections of memory cells (not shown) in components 305, and chip-select signals on primary port DCNTL and associated with the commands allow address-buffer component 315 to select individual integrated-circuit DRAM dies, or "chips," for both access and power-state management. Data-buffer components 310 and address-buffer component 315 each acts as a signal buffer to reduce loading on module connector 312. This reduced loading is in large part because each buffer component presents a single load to module connector 312 in lieu of the multiple DRAM dies each buffer component serves.

Each of the nine data-buffer components 310 communicates eight-wide data for a total of 72 data bits. In general, N*64 data bits are encoded into N*72 signals, where N is an integer larger than zero (in modern systems, N is usually 1 or 2), where the additional N*8 data bits allow for error detection and correction.

Each component on module 300 can include one or more instance of a timing-calibration circuit 350 like circuit 100 of FIG. 1. In this example, each data buffer 310 receives a reference clock signal with command signals on bus BCOM. Clock signals are likewise conveyed from RCD 315 to each DRAM component 305. Calibration circuit 350 allows RCD 315 to calibrate the data timing to match the clock timing at each DRAM interface. RCD 315 and/or DRAMs 305 can likewise incorporate power-efficient timing-calibration circuits in support of high signaling rates. Using the example from FIG. 1, the signal from each output pin or pad of the components on memory module 300 can be connected through a fixed RC delay element 147. When a fractional delay is needed for a signal associated with a given pad or pin, phase interpolator 125 is powered on to calibrate a fractional RC delay element 145 associated with that pad or pin. Interpolator 125 can then be used to calibrate another fractional delay or powered down to save power. Though not shown, RCD 315 and individual DRAM dies or components 305 can likewise include circuitry to introduce fractional delays.

While the present invention has been described in connection with specific embodiments, variations of these embodiments will be obvious to those of ordinary skill in the art. For example, the timing-calibration circuitry can be used to advantage outside of memory systems. Moreover, some components are shown directly connected to one another while others are shown connected via intermediate components. In each instance the method of interconnection establishes some desired electrical communication between two or more circuit nodes, or terminals. Such interconnection may often be accomplished using a number of circuit configurations, as will be understood by those of skill in the art. Therefore, the spirit and scope of the appended claims should not be limited to the foregoing description. Only those claims specifically reciting "means for" or "step for" should be construed in the manner required under the sixth paragraph of 35 U.S.C. § 112.

What is claimed is:

1. A clock-generation circuit, including:
a phase interpolator issuing a phase-interpolated clock signal; and
a fractional-delay circuit receiving the phase-interpolated clock signal, the fractional-delay circuit having:
first passive delay element, controlled by a first delay-control signal, issuing a first fractional-delay clock signal phase offset by a first fraction of the period of the phase-interpolated clock signal; and
second passive delay element, controlled by a second delay-control signal, issuing a second fractional-delay clock signal phase offset by a second fraction of the period of the phase-interpolated clock signal;
wherein the phase interpolator is powered on to calibrate the first and second passive delay elements and powered off after calibration.

2. The circuit of claim 1, where the phase interpolator responds to a reference clock signal.

3. The circuit of claim 1, where the first and second delay elements are passive.

4. The circuit of claim 3, where the first and second delay elements exhibit respective first and second RC time constants that are functions of the respective first and second delay-control signals.

5. The circuit of claim 1, including a state machine for generating the first and second delay-control signals.

6. The circuit of claim 1, further comprising first and second additional delay elements respectively in series with each of the first and second delay elements.

7. The circuit of claim 1, where the first and second fractions are less than one.

8. The circuit of claim 1, where the fractions of the period of the phase-interpolated clock signal are integer multiples of the period divided by a power of two.

9. The circuit of claim 8, where the power of two is sixty-four.

10. An integrated-circuit (IC) module comprising:
a printed-circuit board (PCB) with signal traces; and
at least one IC component including:
a phase interpolator issuing a phase-interpolated clock signal; and
a fractional-delay circuit receiving the phase-interpolated clock signal, with a first passive delay element, controlled by a first delay-control signal, issuing a first fractional-delay clock signal; and a second passive delay element, controlled by a second delay-control signal, issuing a second fractional-delay clock signal;
wherein the phase interpolator is powered on to calibrate the first and second passive delay elements and powered off after calibration.

11. The module of claim 10, where the interpolator responds to a reference clock signal.

12. The module of claim 10, where the first and second delay elements are passive.

13. The circuit of claim 12, where the first and second delay elements exhibit respective first and second RC time constants that are functions of the respective first and second delay-control signals.

14. The module of claim 10, the IC component including a state machine generating the first and second delay-control signals.

15. The module of claim 10, the at least one IC component including a memory component and a data buffer buffering data signal to the memory component.

16. A method comprising:
interpolating between phases of a reference clock signal via a phase interpolator and thereby producing an interpolated clock signal;
delaying the reference clock signal by N+1 phase delays via respective N+1 passive delay elements and thereby producing N+1 delayed clock signals;
phase aligning each of the delayed clock signals with the interpolated clock signal; and
detecting phase alignments between the delayed clock signals and the interpolated clock signal and responsively ceasing the interpolating.

17. The method of claim 16, further comprising gating N+1 data signals each responsive to a respective one of the delayed clock signals.

18. The method of claim 17, further comprising passing the gated data signals to a memory.

19. The method of claim 16, where the interpolating comprises drawing power from a power supply and the delaying is passive.

* * * * *